United States Patent
Adachi et al.

(10) Patent No.: US 12,029,127 B2
(45) Date of Patent: Jul. 2, 2024

(54) THERMOELECTRIC CONVERSION MATERIAL, THERMOELECTRIC CONVERSION ELEMENT, THERMOELECTRIC CONVERSION MODULE, AND LIGHT SENSOR

(71) Applicants: Sumitomo Electric Industries, Ltd., Osaka (JP); Toyota School Foundation, Nagoya (JP)

(72) Inventors: Masahiro Adachi, Osaka (JP); Yoshiyuki Yamamoto, Osaka (JP); Tsunehiro Takeuchi, Nagoya (JP)

(73) Assignees: SUMITOMO ELECTRIC INDUSTRIES, LTD., Osaka (JP); TOYOTA SCHOOL FOUNDATION, Nagoya (JP)

( * ) Notice: Subject to any disclaimer, the term of this patent is extended or adjusted under 35 U.S.C. 154(b) by 123 days.

(21) Appl. No.: 17/620,742

(22) PCT Filed: Jun. 19, 2020

(86) PCT No.: PCT/JP2020/024143
§ 371 (c)(1),
(2) Date: Dec. 20, 2021

(87) PCT Pub. No.: WO2021/002221
PCT Pub. Date: Jan. 7, 2021

(65) Prior Publication Data
US 2022/0416143 A1    Dec. 29, 2022

(30) Foreign Application Priority Data
Jul. 3, 2019    (JP) ................. 2019-124225

(51) Int. Cl.
*H10N 10/855* (2023.01)
*G01J 1/02* (2006.01)
*H10N 10/17* (2023.01)

(52) U.S. Cl.
CPC ........ *H10N 10/8552* (2023.02); *G01J 1/0252* (2013.01); *H10N 10/17* (2023.02)

(58) Field of Classification Search
CPC .................................................... G01J 1/0252
See application file for complete search history.

(56) References Cited

U.S. PATENT DOCUMENTS

| | | | |
|---|---|---|---|
| 6,498,288 B1 | 12/2002 | Abe et al. | |
| 2004/0031515 A1* | 2/2004 | Sadatomi | H10N 10/17 136/239 |

(Continued)

FOREIGN PATENT DOCUMENTS

| | | |
|---|---|---|
| JP | 8-56020 A | 2/1996 |
| JP | 2001-348218 A | 12/2001 |

(Continued)

OTHER PUBLICATIONS

Usenko et al, Enhanced thermoelectric figure of merit of p-type Si0.8Ge0.2 nanostructured spark plasma sintered alloys with embedded SiO2 nanoinclusions, Scripta Materialia 127 (2017) 63-67 (Year: 2017).*

(Continued)

Primary Examiner — Andrew J Golden
(74) Attorney, Agent, or Firm — XSENSUS LLP (57) ABSTRACT

A thermoelectric conversion material includes a base material that is a semiconductor having Si and Ge as constituent elements, a first additive element that is different from the constituent elements, has a vacant orbital in a d or f orbital located inside an outermost shell thereof, and forms a first (Continued)

additional level in a forbidden band of the base material, and oxygen. The oxygen content ratio is 6 at % or less.

15 Claims, 7 Drawing Sheets

(56) References Cited

U.S. PATENT DOCUMENTS

2016/0126440 A1  5/2016  Adachi et al.
2019/0214538 A1  7/2019  Adachi et al.

FOREIGN PATENT DOCUMENTS

| JP | 2015-79796 A | 4/2015 |
| WO | 00/30975 A1 | 6/2000 |
| WO | 2014/196475 A1 | 12/2014 |
| WO | 2018/043478 A1 | 3/2018 |

OTHER PUBLICATIONS

Takiguchi et al., "Nano Structural and Thermoelectric Properties of SiGeAu Thin Films", Japanese Journal of Applied Physics, Apr. 20, 2011, vol. 50, pp. 1-5.
Matoba et al., "Crystallinity and Thermoelectric Properties of Si/GeB Multilayers Prepared with Si Buffer Layer and SiO2 Substrates", Japanese Journal of Applied Physics, Jun. 22, 2009, vol. 48, pp. 1-4.

* cited by examiner

THERMOELECTRIC CONVERSION MATERIAL, THERMOELECTRIC CONVERSION ELEMENT, THERMOELECTRIC CONVERSION MODULE, AND LIGHT SENSOR

CROSS-REFERENCE TO RELATED APPLICATIONS

The present application is based on PCT filing PCT/JP2020/024143, filed Jun. 19, 2020, and claims priority to Japanese Application No. 2019-124225, filed Jul. 3, 2019, the entire contents of each are incorporated herein by reference.

TECHNICAL FIELD

The present disclosure relates to a thermoelectric conversion material, a thermoelectric conversion element, a thermoelectric conversion module, and an optical sensor.

BACKGROUND ART

For a thermoelectric conversion material, a technique has been reported in which Si, Ge, and Au are layered and the obtained layered body is heated to form Au nanoparticles in silicon germanium (SiGe) (for example, Non Patent Literature 1). A technique of using Si/GeB for a thermoelectric conversion material has also been reported (for example, Non Patent Literature 2).

Patent Literature 1 discloses a thermoelectric conversion material that includes nanoparticles in a base material made of a semiconductor material composed of a base material element, each nanoparticle including the base material element and a heterogeneous element different from the base material element.

CITATION LIST

Patent Literature

Patent Literature 1: International Patent Publication No. WO 2014/196475

Non Patent Literature

Non Patent Literature 1: Hiroaki Takiguchi et al., "Nano Structural and Thermoelectric Properties of SiGeAu Thin Films", Japanese Journal of Applied Physics 50 (2011) 041301

Non Patent Literature 2: Akinari Matoba et al., "Crystallinity and Thermoelectric Properties of Si/GeB Multilayers Prepared with Si Buffer Layer and Sift Substrates", Japanese Journal of Applied Physics 48 (2009) 061201

SUMMARY OF INVENTION

A thermoelectric conversion material according to the present disclosure includes a base material that is a semiconductor having Si and Ge as constituent elements, a first additive element that is different from the constituent elements, has a vacant orbital in a d or f orbital located inside an outermost shell thereof, and forms a first additional level in a forbidden band of the base material, and oxygen. The oxygen content ratio is 6 at % or less.

DESCRIPTION OF EMBODIMENTS

Problems to be Solved by the Present Disclosure

In recent years, renewable energy has been drawing attention as clean energy to replace fossil fuels such as petroleum. Renewable energy includes energy obtained through power generation using solar light, hydraulic power, and wind power, as well as energy obtained through power generation by thermoelectric conversion using a temperature difference. In the thermoelectric conversion, heat is directly converted into electric power, so no extra waste is discharged during the conversion. Since there is no need for a motor or other drive unit, the thermoelectric conversion offers advantages such as easy maintenance of devices.

Efficiency η in converting a temperature difference (heat energy) into electric energy using a material (thermoelectric conversion material) for thermoelectric conversion is given by the following expression (1).

$$\eta = \Delta T / T_h \cdot (M-1)/(M+T_c/T_h) \qquad (1)$$

In the expression, η represents a conversion efficiency, ΔT represents a difference between $T_h$ and $T_c$, $T_h$ represents a temperature on the high temperature side, $T_c$ represents a temperature on the low temperature side, M equals to $(1+ZT)^{1/2}$, $ZT=\alpha^2 ST/\kappa$, ZT represents a dimensionless figure of merit, a represents a Seebeck coefficient, S represents an electrical conductivity, and κ represents a thermal conductivity. The conversion efficiency is a monotonously increasing function of ZT. It is important to increase ZT in developing a thermoelectric conversion material.

There has been required a thermoelectric conversion material having a higher conversion efficiency than the thermoelectric conversion materials disclosed in Non Patent Literature 1, Non Patent Literature 2, and Patent Literature 1. If ZT can be increased, the efficiency of thermoelectric conversion can be improved.

In view of the foregoing, one of the objects is to provide a thermoelectric conversion material, a thermoelectric conversion element, a thermoelectric conversion module, and an optical sensor with improved efficiency of thermoelectric conversion.

Advantageous Effects of the Present Disclosure

According to the thermoelectric conversion material described above, the efficiency of thermoelectric conversion can be improved.

DESCRIPTION OF EMBODIMENTS OF THE PRESENT DISCLOSURE

Firstly, embodiments of the present disclosure will be listed and described. A thermoelectric conversion material according to the present disclosure includes a base material that is a semiconductor having Si and Ge as constituent elements, a first additive element that is different from the constituent elements, has a vacant orbital in a d or f orbital located inside an outermost shell thereof, and forms a first additional level in a forbidden band of the base material, and oxygen. The oxygen content ratio is 6 at % or less.

The above thermoelectric conversion material includes the base material that is the semiconductor having Si and Ge as the constituent elements. Since such a semiconductor has a larger band gap than an electrically conductive material, the Seebeck coefficient can be high. As a result, the dimensionless figure of merit, ZT, can be increased by adopting the above-described base material.

The above thermoelectric conversion material, by including the first additive element, can form the first additional level as a new level in the forbidden band of the base material. Since the first additive element has a vacant orbital in a d or f orbital located inside the outermost shell, the energy width of the first additional level can be small. Therefore, the electrical conductivity can be increased despite the high Seebeck coefficient. The above thermoelectric conversion material includes oxygen, with the oxygen content ratio of 6 at % or less. This can reduce a risk that the oxygen contained in the thermoelectric conversion material combines with the constituent element or the first additive element to form an oxide having high electrical resistance. As a result, the decrease in electrical conductivity in the thermoelectric conversion material can be suppressed. From the foregoing, according to the thermoelectric conversion material described above, the efficiency of thermoelectric conversion can be improved. Although the oxygen content ratio is preferably as low as possible, from the standpoint of achieving an energy filtering effect, it is preferable to be not less than 0.01 at %. This will result in the formation of thin oxide films at the grain boundaries, which films are expected to provide the energy filtering effect to increase the Seebeck coefficient.

In the above thermoelectric conversion material, a microstructure of the thermoelectric conversion material may include a crystal phase composed of the constituent elements and having a grain diameter of 30 nm or less. The crystal phase has a higher electrical conductivity than the amorphous phase, so ZT is increased. On the other hand, if the grain size of the crystal phase becomes too large, the thermal conductivity tends to increase. By setting the grain diameter of the crystal phase composed of the constituent elements to be 30 nm or less, the increase in thermal conductivity can be suppressed. Thus, according to such a thermoelectric conversion material, the increase in thermal conductivity can be suppressed while the electrical conductivity is improved. Accordingly, ZT can be increased to further improve the efficiency of thermoelectric conversion. The grain diameter of the crystal phase may be 10 nm or less. This can further suppress the increase in thermal conductivity and improve the efficiency of thermoelectric conversion.

The above thermoelectric conversion material may further include a second additive element that is different from the constituent elements and the first additive element and forms a second additional level in the forbidden band of the base material. A difference between the number of electrons in an outermost shell of the second additive element and the number of electrons in an outermost shell of at least one of the constituent elements may be 1. With this, the Fermi level can be controlled by forming an acceptor level or a donor level with the second additional level formed by the second additive element. As a result, ZT can be increased more reliably to improve the efficiency of thermoelectric conversion.

In the above thermoelectric conversion material, the first additive element may be Fe. With this, the first additional level as a new level can be formed in the forbidden band with Fe as the first additive element. In addition, the Fermi level can be controlled by Fe to some extent. As a result, ZT can be increased to improve the efficiency of thermoelectric conversion.

In the above thermoelectric conversion material, the first additive element may be Au or Cu. With this, the first additional level as a new level can be formed in the forbidden band with Au or Cu as the first additive element. In addition, the Fermi level can be controlled by Au or Cu to some extent. As a result, ZT can be increased to improve the efficiency of thermoelectric conversion.

In the above thermoelectric conversion material, the first additive element may be Fe. The second additive element may be P. With this, the first additional level as a new level can be formed in the forbidden band with Fe as the first additive element. In addition, with P as the second additive element, the Fermi level can be controlled by forming a donor level with the second additional level formed by the second additive element. As a result, ZT can be increased more reliably to improve the efficiency of thermoelectric conversion.

In the above thermoelectric conversion material, the first additive element may be Au or Cu. The second additive element may be B. With this, the first additional level as a new level can be formed in the forbidden band with Au or Cu as the first additive element. In addition, with B as the second additive element, the Fermi level can be controlled by forming an acceptor level with the second additional level formed by the second additive element. As a result, ZT can be increased more reliably to improve the efficiency of thermoelectric conversion.

A thermoelectric conversion element of the present disclosure includes: a thermoelectric conversion material portion; a first electrode disposed in contact with the thermoelectric conversion material portion; and a second electrode disposed in contact with the thermoelectric conversion material portion and apart from the first electrode. The thermoelectric conversion material portion is constituted by the above-described thermoelectric conversion material of the present disclosure with its component composition adjusted to have p type or n type conductivity.

In the thermoelectric conversion element of the present disclosure, the material constituting the thermoelectric conversion material portion is the above-described thermoelectric conversion material having excellent thermoelectric conversion characteristics, with its component composition adjusted to have p type or n type conductivity. Therefore, according to the thermoelectric conversion element of the present disclosure, a thermoelectric conversion element excellent in conversion efficiency can be provided.

A thermoelectric conversion module of the present disclosure includes a plurality of the above-described thermoelectric conversion elements. According to the thermoelectric conversion module of the present disclosure, by it including the plurality of thermoelectric conversion elements of the present disclosure excellent in efficiency of thermoelectric conversion, a thermoelectric conversion module with improved efficiency of thermoelectric conversion can be obtained.

An optical sensor of the present disclosure includes: an absorber that absorbs optical energy; and a thermoelectric conversion material portion connected to the absorber. The thermoelectric conversion material portion is constituted by the above-described thermoelectric conversion material of the present disclosure, with its component composition adjusted to have p type or n type conductivity.

In the optical sensor of the present disclosure, the material constituting the thermoelectric conversion material portion is the above-described thermoelectric conversion material excellent in thermoelectric conversion characteristics, with its component composition adjusted to have p type or n type conductivity. Therefore, an optical sensor of high sensitivity can be provided.

DETAILS OF EMBODIMENTS OF THE PRESENT DISCLOSURE

Embodiments of the thermoelectric conversion material of the present disclosure will be described below with reference to the drawings. In the drawings referenced below, the same or corresponding parts are denoted by the same reference numerals and the descriptions thereof are not repeated.

Embodiment 1

A description will be made of a configuration of a thermoelectric conversion material according to Embodiment 1 of the present disclosure. The thermoelectric conversion material according to Embodiment 1 of the present disclosure includes a base material that is a semiconductor having Si and Ge as constituent elements, a first additive element that is different from the constituent elements and has a vacant orbital in a d or f orbital located inside (located adjacent to) an outermost shell thereof, and oxygen. The base material is SiGe, for example, which is a semiconductor. Specifically, the constituent elements are Si and Ge. The first additive element is Fe. Fe is a transition metal. A first additional level formed by Fe is present in a forbidden band of SiGe. With this, when the base material is SiGe, the first additional level as a new level can be formed in the forbidden band with Fe as the first additive element. Further, with Fe, the Fermi level can be controlled to some extent. The content ratio of oxygen is 6 at % or less. This can reduce the risk that the oxygen contained in the thermoelectric conversion material combines with the constituent element or the first additive element to form an oxide having high electrical resistance. As a result, the decrease in electrical conductivity in the thermoelectric conversion material can be suppressed. Accordingly, ZT can be increased to improve the efficiency of thermoelectric conversion. It should be noted that Au or Cu may be used as the first additive element instead of Fe. This enables formation of the first additional level as a new level in the forbidden band. Further, with Au or Cu, the Fermi level can be controlled to some extent. Accordingly, ZT can be increased to improve the efficiency of thermoelectric conversion.

The thermoelectric conversion material according to Embodiment 1 can be produced with the following producing method. Firstly, measured Si, Ge, and Fe powders are introduced into a stainless steel pot. In this case, the content ratios of the elements are adjusted to be: $Si_{65}Ge_{25}Fe_{10}$. Further, the pot is filled with a forming gas, which is a mixture of hydrogen and nitrogen with the hydrogen content ratio of 4 vol % or less, to attain a reducing atmosphere. At the time of filling the forming gas, the atmosphere inside the piping used for filling is replaced with Ar gas before filling the forming gas. This will greatly reduce the amount of oxygen contained in the pot. Then, with mechanical alloying, the Fe powder is added to SiGe, whereby an amorphous powder adjusted in oxygen content ratio is obtained. It should be noted that even when Au or Cu is used as the first additive element, Au or Cu powder can be added to SiGe through mechanical alloying in a similar manner as above, to obtain an amorphous powder with an adjusted oxygen content ratio.

Next, with a glove box held in a nitrogen gas atmosphere, the obtained powder is filled into a die to form a sintered material using a spark plasma sintering method. The temperature at this time can be, for example, 600° C. In this manner, the thermoelectric conversion material is produced that is composed of the sintered material having a crystal phase of the constituent elements, in the present embodiment the crystal phase of SiGe, exiting in the amorphous phase and that has the oxygen content ratio of 6 at % or less. The oxygen content ratio can be measured in accordance with scanning electron microscope-energy dispersive X-ray spectrometry (SEM-EDX), for example. As a specific way of measuring the oxygen content ratio, an EDX system, OCTANE PLUS manufactured by AMETEK, Inc., attached to an SEM, S-4300SE manufactured by Hitachi High-Technologies Corporation, can be used with the SEM acceleration voltage of 5.0 kV, and the oxygen content ratio can be calculated from the detected ratios of Si, Ge, Fe, and O (oxygen).

Figure 1:
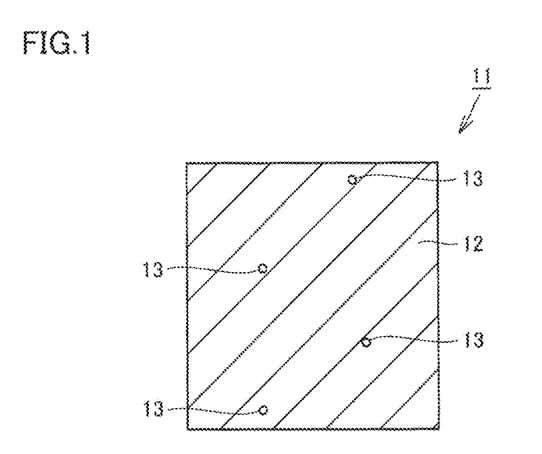
FIG. 1 is a schematic diagram showing a state of the microstructure of a thermoelectric conversion material according to Embodiment 1.

FIG. 1 is a schematic diagram showing a state of the microstructure of the thermoelectric conversion material in Embodiment 1. Referring to FIG. 1, the microstructure of the thermoelectric conversion material 11 includes an amorphous phase 12 and a crystal phase 13. The amorphous phase 12 has SiGe, the constituent elements, as its main components. Here, the content ratio of SiGe contained as the main component is, for example, 50 mass % or more, preferably 90 mass % or more, and further preferably 95% or more. The crystal phase 13 is a microcrystal composed of the constituent elements, SiGe. The crystal phase 13 exists in the amorphous phase 12. In the present embodiment, a plurality of granular crystal phases 13 exist dispersed in the amorphous phase 12. The crystal phases 13 each have a grain diameter of 30 nm or less. The grain diameter of the crystal phase 13 can be measured from a TEM image taken of the thermoelectric conversion material. Specifically, the grain diameter is measured by observing a high-resolution transmission electron microscopy (TEM) image obtained with a field emission transmission electron microscope (apparatus name: JEM-2100F (manufactured by JEOL Ltd.)) after slicing the material to approximately 100 nm with focused ion beam (FIB) in the stacking direction.

In the thermoelectric conversion material 11, the microstructure of the thermoelectric conversion material includes the amorphous phase 12 having the constituent elements as the main components, and the crystal phase 13 of the constituent elements exists in the amorphous phase 12. The thermoelectric conversion material including the amorphous phase 12 can be lowered in thermal conductivity. Thus, ZT can be increased. With the crystal phase 13 composed of the constituent elements being present in the amorphous phase 12, the electrical conductivity of the thermoelectric conversion material 11 can be improved. Thus, ZT can be increased. Further, since the crystal phase 13 has a higher electrical conductivity than the amorphous phase 12, ZT is increased. On the other hand, if the grain diameter of the crystal phase 13 becomes too large, the thermal conductivity tends to increase. With the grain diameter of the crystal phase 13 composed of the constituent elements being set to be 30 nm or less, the increase in thermal conductivity can be suppressed.

There is a risk that the oxygen contained in the thermoelectric conversion material combines with the constituent element, Si, Ge, or the first additive element, Fe, to form an oxide having relatively high electrical resistance. In particular, the amorphous phase 12 and the crystal phase 13 both have a structure liable to combine with oxygen to form an oxide. However, the thermoelectric conversion material of the present disclosure has a low oxygen content ratio of 6 at % or less. Therefore, in the thermoelectric conversion material, the risk of forming an oxide having high electrical resistance can be reduced. As a result, the decrease in electrical conductivity in the thermoelectric conversion material can be suppressed. Thus, according to the thermoelectric conversion material 11 as described above, the increase in thermal conductivity can be suppressed while the electrical conductivity is improved. Accordingly, ZT can be increased to further improve the efficiency of thermoelectric conversion.

Figure 2:
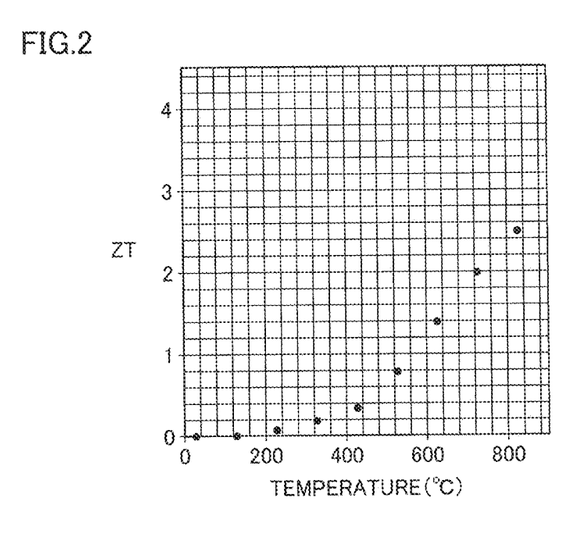
FIG. 2 is a graph showing a relationship between a temperature and ZT of the thermoelectric conversion material according to Embodiment 1.

A relationship between a temperature and ZT of the obtained thermoelectric conversion material was derived. FIG. 2 is a graph showing the relationship between the temperature and ZT of the thermoelectric conversion material in Embodiment 1. In FIG. 2, the horizontal axis represents temperature (° C.) and the vertical axis represents ZT. FIG. 2 is a graph in the case of the thermoelectric conversion material in Embodiment 1 having the oxygen content ratio of 5 at %. For ZT in FIG. 2, the resistivity, Seebeck coefficient, and thermal conductivity of the thermoelectric conversion material were measured in a vacuum, and the value of ZT was derived from the obtained measurement results. FIG. 2 shows the results of the measurement while the material was heated from a low temperature to a high temperature.

Thermoelectric characteristics were measured using a thermoelectric characteristic measuring device (RZ2001i manufactured by Ozawa Science Co., Ltd.) The way of measuring the thermoelectric characteristics is as follows. Firstly, with a thermoelectric conversion material being fixed bridged between a pair of quartz fixtures, the atmosphere is heated using a resistive heating furnace. One of the quartz fixtures is made hollow to let nitrogen gas flow therein for cooling, thereby cooling one end portion of the thermoelectric conversion material. This gives a temperature difference to the thermoelectric conversion material. In the thermoelectric conversion material, a temperature difference between two points on a surface of the thermoelectric conversion material is measured using a platinum-platinum rhodium thermocouple (type R thermocouple). A voltmeter is connected to the thermocouple to measure a voltage generated due to the temperature difference between the two points. This makes it possible to measure the generated voltage with respect to the temperature difference, and on the basis of this to estimate a Seebeck coefficient of the material. A resistance value is measured in accordance with a four-terminal method. Specifically, two electric wires are connected on the outer side relative to two platinum wires to which the voltmeter is connected. Then, a current is passed through the electric wires and the amount of voltage drop is measured using the voltmeter located on the inner side. In this manner, the resistance value of the thermoelectric conversion material is measured in accordance with the four-terminal method.

Referring to FIG. 2, the value of ZT increases with increasing temperature from room temperature to 900° C. At 700° C., ZT exhibits a high value of not lower than 2. Even when the temperature exceeds 700° C., the value of ZT continues to increase. At 800° C., ZT attains a value close to 2.5. If the oxygen content ratio is greater than 6 at %, the value of ZT will not increase after the temperature exceeds 700° C. Therefore, the thermoelectric conversion material of the present disclosure is used at as high a temperature as possible, so that thermoelectric conversion can be performed with a high value of ZT. More specifically, the use of the material at around 800° C. enables thermoelectric conversion with a ZT value of 2.5, ensuring further improvement in the efficiency of thermoelectric conversion.

In the above embodiment, the thermoelectric conversion material of the present disclosure may include a first additive element that has a vacant orbital in an f orbital located inside the outermost shell.

Embodiment 2

A description will now be made of a configuration of a thermoelectric conversion material according to Embodiment 2 of the present disclosure. The thermoelectric conversion material according to Embodiment 2 of the present disclosure includes a base material that is a semiconductor having Si and Ge as constituent elements, a first additive element that is different from the constituent elements and has a vacant orbital in a d or f orbital located inside (located adjacent to) an outermost shell thereof, and oxygen. The base material is SiGe, for example, which is a semiconductor. Specifically, the constituent elements are Si and Ge. The first additive element is Fe. Fe is a transition metal. A first additional level formed by Fe is present in a forbidden band of SiGe. With this, when the base material is SiGe, the first additional level as a new level can be formed in the forbidden band with Fe as the first additive element. The content ratio of oxygen is 6 at % or less. This can reduce the risk that the oxygen contained in the thermoelectric conversion material combines with the constituent element or the first additive element to form an oxide having high electrical resistance. As a result, the decrease in electrical conductivity in the thermoelectric conversion material can be suppressed. It should be noted that Au or Cu may be used as the first additive element instead of Fe. This enables formation of the first additional level as a new level in the forbidden band.

The thermoelectric conversion material according to Embodiment 2 further includes a second additive element. The second additive element is different from the constituent elements and the first additive element. A difference between the number of electrons in an outermost shell of the second additive element and the number of electrons in an outermost shell of the constituent element is 1. In the present embodiment, the second additive element is P. A second additional level formed by P is present between the first additional level and a conduction band, which is an energy band closer to the first additional level than a valence band, the valence band and the conduction band being adjacent to the forbidden band of SiGe. In this manner, with P as the second additive element, the Fermi level can be controlled by forming a donor level with the second additional level formed by the second additive element. As a result, ZT can be increased more reliably to improve the efficiency of thermoelectric conversion. It should be noted that B can be used as the second additive element when Au or Cu is used as the first additive element. In this manner, with B as the second additive element, the Fermi level can be controlled by forming an acceptor level with the second additional level formed by the second additive element. As a result, ZT can be increased more reliably to improve the efficiency of thermoelectric conversion.

The thermoelectric conversion material according to Embodiment 2 can be produced with the following producing method. Firstly, measured Si, Ge, Fe, and P powders are introduced into a stainless steel pot. In this case, the content ratios of the elements are adjusted to be: $Si_{63}Ge_{24}P_{10}Fe_3$. Further, the pot is filled with a forming gas, which is a mixture of hydrogen and nitrogen with the hydrogen content ratio of 4 vol % or less, to attain a reducing atmosphere. At the time of filling the forming gas, the atmosphere inside the piping used for filling is replaced with Ar gas before filling the forming gas. This will greatly reduce the amount of oxygen contained in the pot. Then, with mechanical alloying, the Fe and P powders are added to SiGe, whereby an amorphous powder adjusted in oxygen content ratio is obtained. It should be noted that even when Au or Cu is used as the first additive element and B as the second additive element, Au or Cu powder and B powder can be added to SiGe through mechanical alloying in a similar manner as above, to obtain an amorphous powder with an adjusted oxygen content ratio.

Next, with a glove box held in a nitrogen gas atmosphere, the obtained powder is filled into a die to form a sintered material using the spark plasma sintering method. The temperature at this time can be, for example, 600° C. In this manner, the thermoelectric conversion material is produced that is composed of the sintered material having the crystal phase of the constituent elements, in the present embodiment the crystal phase of SiGe, exiting in the amorphous phase and that has the oxygen content ratio of 6 at % or less. The oxygen content ratio can be measured in accordance with scanning electron microscope-energy dispersive X-ray spectrometry (SEM-EDX), for example. As a specific way of measuring the oxygen content ratio, an EDX system, OCTANE PLUS manufactured by AMETEK, Inc., attached to an SEM, S-4300SE manufactured by Hitachi High-Technologies Corporation, can be used with the SEM acceleration voltage of 5.0 kV, and the oxygen content ratio can be calculated from the detected ratios of Si, Ge, Fe, P, and O (oxygen).

Figure 3:
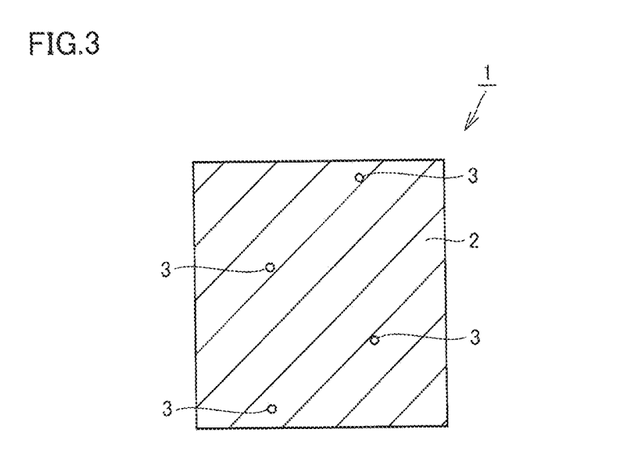
FIG. 3 is a schematic diagram showing a state of the microstructure of a thermoelectric conversion material according to Embodiment 2.

FIG. 3 is a schematic diagram showing a state of the microstructure of the thermoelectric conversion material in Embodiment 2. Referring to FIG. 3, the microstructure of the thermoelectric conversion material 1 includes an amorphous phase 2 and a crystal phase 3, as in the case shown in FIG. 1. The amorphous phase 2 has SiGe, the constituent elements, as its main components. Here, the content ratio of SiGe contained as the main component is, for example, 50 mass % or more, preferably 90 mass % or more, and further preferably 95% or more. The crystal phase 3 is a microcrystal composed of the constituent elements, SiGe. The crystal phase 3 exists in the amorphous phase 2. In the present embodiment, a plurality of granular crystal phases 3 exist dispersed in the amorphous phase 2. The crystal phases 3 each have a grain diameter of 30 nm or less. The grain diameter of the crystal phase 3 can be measured from a TEM image taken of the thermoelectric conversion material. Specifically, the grain diameter is measured by observing a high-resolution transmission electron microscopy (TEM) image obtained with a field emission transmission electron microscope (apparatus name: JEM-2100F (manufactured by JEOL Ltd.)) after slicing the material to approximately 100 nm with focused ion beam (FIB) in the stacking direction.

In the thermoelectric conversion material 1, the microstructure of the thermoelectric conversion material includes the amorphous phase 2 having the constituent elements as the main components, and the crystal phase 3 of the constituent elements exists in the amorphous phase 2. The thermoelectric conversion material including the amorphous phase 2 can be lowered in thermal conductivity. Thus, ZT can be increased. With the crystal phase 3 composed of the constituent elements being present in the amorphous phase 2, the electrical conductivity of the thermoelectric conversion material 1 can be improved. Thus, ZT can be increased. Further, since the crystal phase 3 has a higher electrical conductivity than the amorphous phase 2, ZT is increased. On the other hand, if the grain diameter of the crystal phase 3 becomes too large, the thermal conductivity tends to increase. With the grain diameter of the crystal phase 3 composed of the constituent elements being set to be 30 nm or less, the increase in thermal conductivity can be suppressed.

There is a risk that the oxygen contained in the thermoelectric conversion material combines with the constituent element, Si, Ge, or the first additive element, Fe, to form an oxide having relatively high electrical resistance. In particular, the amorphous phase 2 and the crystal phase 3 both have a structure liable to combine with oxygen to form an oxide. However, the thermoelectric conversion material of the present disclosure has a low oxygen content ratio of 6 at % or less. Therefore, in the thermoelectric conversion material, the risk of forming an oxide having high electrical resistance can be reduced. As a result, the decrease in electrical conductivity in the thermoelectric conversion material can be suppressed. Thus, according to the thermoelectric conversion material 1 as described above, the increase in thermal conductivity can be suppressed while the electrical conductivity is improved. Accordingly, ZT can be increased to further improve the efficiency of thermoelectric conversion.

Figure 4:
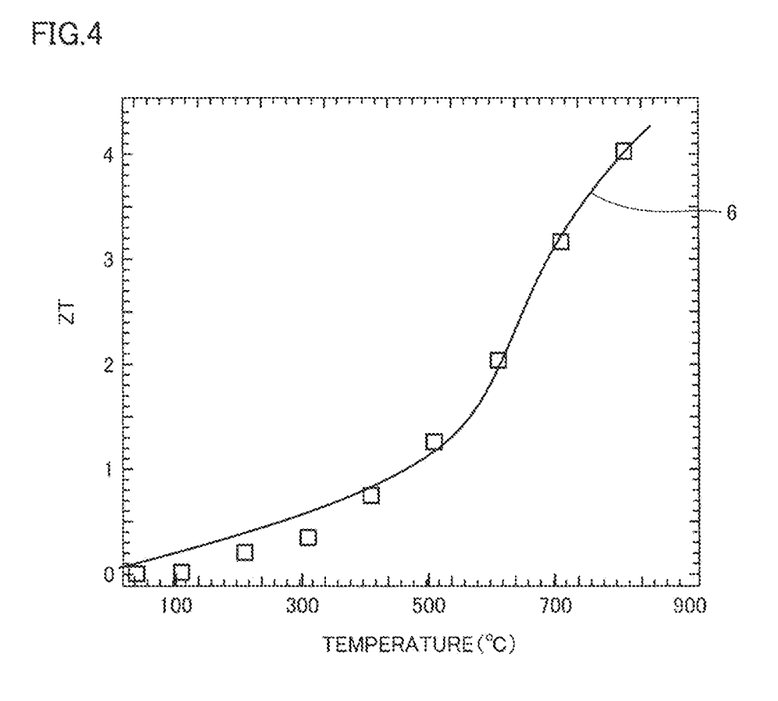
FIG. 4 is a graph showing a relationship between a temperature and ZT of the thermoelectric conversion material according to Embodiment 2.

A relationship between a temperature and ZT of the obtained thermoelectric conversion material was derived. FIG. 4 is a graph showing the relationship between the temperature and ZT of the thermoelectric conversion material in Embodiment 2. In FIG. 4, the horizontal axis represents temperature (° C.) and the vertical axis represents ZT. A line 6 in FIG. 4 represents an eye guide to the plot shown by the squares in the graph. FIG. 4 is a graph in the case of the thermoelectric conversion material in Embodiment 2 having the oxygen content ratio of 5 at %. For ZT in FIG. 4, the resistivity, Seebeck coefficient, and thermal conductivity of the thermoelectric conversion material were measured in a vacuum, and the value of ZT was derived from the obtained measurement results. FIG. 4 shows the results of the measurement while the material was heated from a low temperature to a high temperature.

Thermoelectric characteristics were measured using a thermoelectric characteristic measuring device (RZ2001i manufactured by Ozawa Science Co., Ltd.) The way of measuring the thermoelectric characteristics is as follows. Firstly, with a thermoelectric conversion material being fixed bridged between a pair of quartz fixtures, the atmosphere is heated using a resistive heating furnace. One of the quartz fixtures is made hollow to let nitrogen gas flow therein for cooling, thereby cooling one end portion of the thermoelectric conversion material. This gives a temperature difference to the thermoelectric conversion material. In the thermoelectric conversion material, a temperature difference between two points on a surface of the thermoelectric conversion material is measured using a platinum-platinum rhodium thermocouple (type R thermocouple). A voltmeter is connected to the thermocouple to measure a voltage generated due to the temperature difference between the two points. This makes it possible to measure the generated voltage with respect to the temperature difference, and on the basis of this to estimate a Seebeck coefficient of the material. A resistance value is measured in accordance with a four-terminal method. Specifically, two electric wires are connected on the outer side relative to two platinum wires to which the voltmeter is connected. Then, a current is passed through the electric wires and the amount of voltage drop is measured using the voltmeter located on the inner side. In this manner, the resistance value of the thermoelectric conversion material is measured in accordance with the four-terminal method.

Referring to FIG. 4, the value of ZT increases with increasing temperature from room temperature to 900° C. At 700° C., ZT exhibits a considerably high value of not lower than 3. Even when the temperature exceeds 700° C., the value of ZT continues to increase. At 800° C., ZT attains a value of 4 or higher. If the oxygen content ratio is greater than 6 at %, the value of ZT will not increase after the temperature exceeds 700° C. Therefore, the thermoelectric conversion material of the present disclosure is used at as high a temperature as possible, so that thermoelectric conversion can be performed with a high value of ZT. More specifically, the use of the material at around 800° C. enables thermoelectric conversion with a ZT value of 4 or higher, ensuring further improvement in the efficiency of thermoelectric conversion.

In the above embodiment, the thermoelectric conversion material of the present disclosure may include a first additive element that has a vacant orbital in an f orbital located inside the outermost shell. Further, the second additive element can be omitted. The same applies to the embodiments below.

Embodiment 3

A description will now be made of a power generation element as an embodiment of a thermoelectric conversion element using the thermoelectric conversion material according to the present disclosure.

Figure 5:
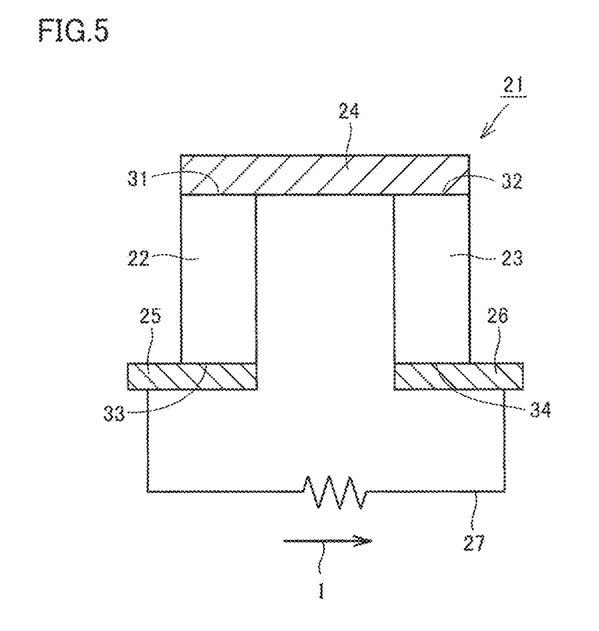
FIG. 5 is a schematic diagram showing the structure of a π type thermoelectric conversion element (power generation element), which is a thermoelectric conversion element in the present embodiment.

FIG. 5 is a schematic diagram showing the structure of a π type thermoelectric conversion element (power generation element) 21, which is the thermoelectric conversion element in the present embodiment. Referring to FIG. 5, the π type thermoelectric conversion element 21 includes a p type thermoelectric conversion material portion 22 as a first thermoelectric conversion material portion, an n type thermoelectric conversion material portion 23 as a second thermoelectric conversion material portion, a high temperature side electrode 24, a first low temperature side electrode 25, a second low temperature side electrode 26, and a wire 27.

The material constituting the p type thermoelectric conversion material portion 22 is the thermoelectric conversion material of Embodiment 1 or Embodiment 2 with its component composition adjusted to have p type conductivity, for example. The thermoelectric conversion material of Embodiment 1 or Embodiment 2 constituting the p type thermoelectric conversion material portion 22 is doped with p type impurities that cause the generation of p type carriers (holes) as majority carriers, for example, so that the p type thermoelectric conversion material portion 22 has p type conductivity.

The material constituting the n type thermoelectric conversion material portion 23 is the thermoelectric conversion material of Embodiment 1 or Embodiment 2 with its component composition adjusted to have n type conductivity, for example. The thermoelectric conversion material of Embodiment 1 or Embodiment 2 constituting the n type thermoelectric conversion material portion 23 is doped with n type impurities that cause the generation of n type carriers (electrons) as majority carriers, for example, whereby the n type thermoelectric conversion material portion 23 has n type conductivity.

The p type thermoelectric conversion material portion 22 and the n type thermoelectric conversion material portion 23 are disposed side by side with a spacing therebetween. The high temperature side electrode 24 is disposed to extend from one end 31 of the p type thermoelectric conversion material portion 22 to one end 32 of the n type thermoelectric conversion material portion 23. The high temperature side electrode 24 is disposed so as to contact both the one end 31 of the p type thermoelectric conversion material portion 22 and the one end 32 of the n type thermoelectric conversion material portion 23. The high temperature side electrode 24 is disposed to connect the one end 31 of the p type thermoelectric conversion material portion 22 and the one end 32 of the n type thermoelectric conversion material portion 23. The high temperature side electrode 24 is composed of an electrically conductive material, such as a metal. The high temperature side electrode 24 is in ohmic contact with the p type thermoelectric conversion material portion 22 and the n type thermoelectric conversion material portion 23.

The first low temperature side electrode 25 is disposed in contact with another end 33 of the p type thermoelectric conversion material portion 22. The first low temperature side electrode 25 is disposed apart from the high temperature side electrode 24. The first low temperature side electrode 25 is composed of an electrically conductive material, such as a metal. The first low temperature side electrode 25 is in ohmic contact with the p type thermoelectric conversion material portion 22.

The second low temperature side electrode 26 is disposed in contact with another end 34 of the n type thermoelectric conversion material portion 23. The second low temperature side electrode 26 is disposed apart from the high temperature side electrode 24 and the first low temperature side electrode 25. The second low temperature side electrode 26 is composed of an electrically conductive material, such as a metal. The second low temperature side electrode 26 is in ohmic contact with the n type thermoelectric conversion material portion 23.

The wire 27 is composed of an electric conductor such as a metal. The wire 27 electrically connects the first low temperature side electrode 25 and the second low temperature side electrode 26.

In the π type thermoelectric conversion element 21, when a temperature difference is formed so that the one end 31 side of the p type thermoelectric conversion material portion 22 and the one end 32 side of the n type thermoelectric conversion material portion 23 are at a high temperature and the other end 33 side of the p type thermoelectric conversion material portion 22 and the other end 34 side of the n type thermoelectric conversion material portion 23 are at a low temperature, for example, then p type carriers (holes) move from the one end 31 side toward the other end 33 side in the p type thermoelectric conversion material portion 22. At this time, in the n type thermoelectric conversion material portion 23, n type carriers (electrons) move from the one end 32 side toward the other end 34 side. As a result, a current flows through the wire 27 in the direction of the arrow I. In this manner, power generation by thermoelectric conversion using a temperature difference is achieved in the π type thermoelectric conversion element 21. In other words, the π type thermoelectric conversion element 21 is a power generation element.

As the materials constituting the p type thermoelectric conversion material portion 22 and the n type thermoelectric conversion material portion 23, the thermoelectric conversion material of Embodiment 1 or Embodiment 2 with an increased value of ZT, for example, is adopted. As a result, the π type thermoelectric conversion element 21 is a highly efficient power generation element.

While the π type thermoelectric conversion element has been described as an example of the thermoelectric conversion element of the present disclosure in the above embodiment, the thermoelectric conversion element of the present disclosure is not limited thereto. The thermoelectric conversion element of the present disclosure may be a thermoelectric conversion element having another structure, such as an I type (unileg) thermoelectric conversion element, for example.

Embodiment 4

Figure 6:
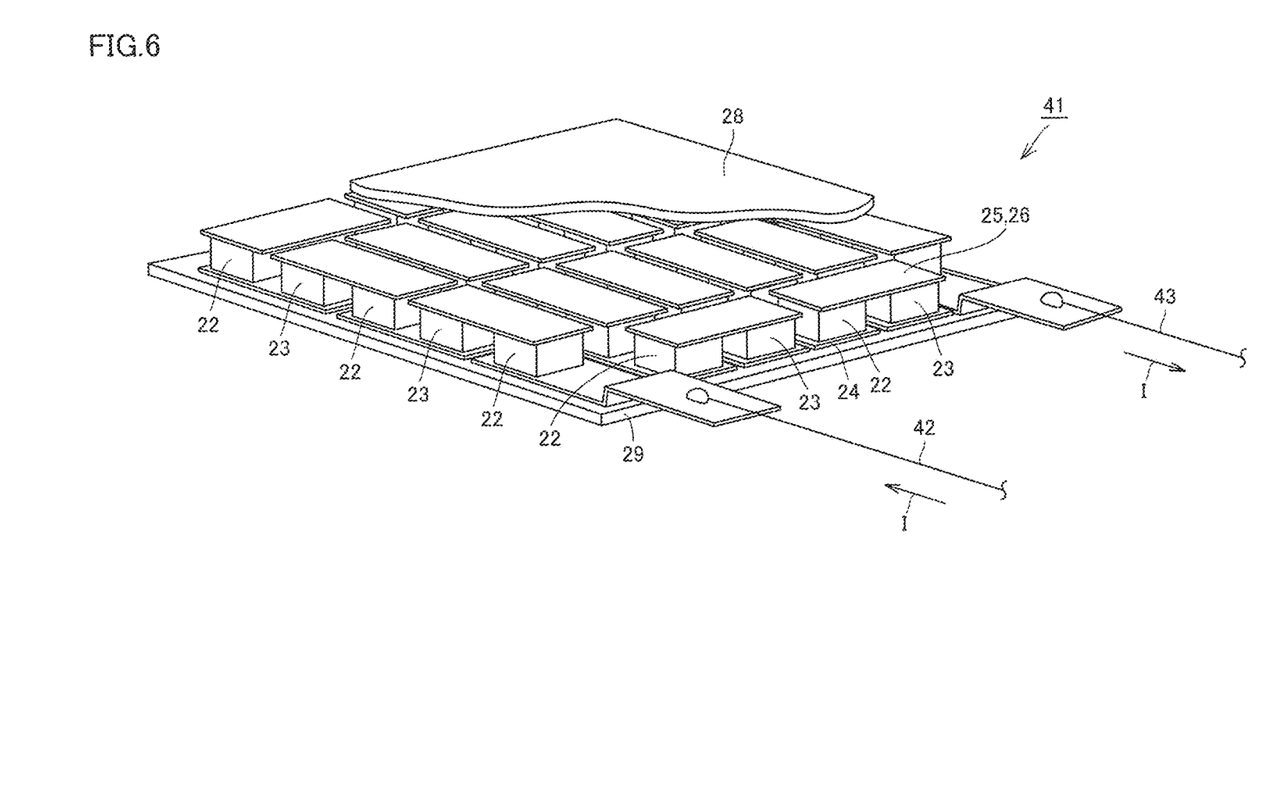
FIG. 6 shows an exemplary structure of a power generation module.

A power generation module as a thermoelectric conversion module can be obtained by electrically connecting a plurality of π type thermoelectric conversion elements 21. A power generation module 41, the thermoelectric conversion module of the present embodiment, has a structure of a plurality of π type thermoelectric conversion elements 21 connected in series.

FIG. 6 shows an exemplary structure of a power generation module. Referring to FIG. 6, the power generation module 41 of the present embodiment includes p type thermoelectric conversion material portions 22, n type thermoelectric conversion material portions 23, low temperature side electrodes 25, 26 each corresponding to the first and second low temperature side electrodes 25 and 26, high temperature side electrodes 24, a low temperature side insulator substrate 28, and a high temperature side insulator substrate 29. The low temperature side insulator substrate 28 and the high temperature side insulator substrate 29 are composed of a ceramic such as alumina. The p type thermoelectric conversion material portions 22 and the n type thermoelectric conversion material portions 23 are arranged alternately side by side. A low temperature side electrode 25, 26 is disposed in contact with a p type thermoelectric conversion material portion 22 and an n type thermoelectric conversion material portion 23, as in the above-described 7C type thermoelectric conversion element 21. A high temperature side electrode 24 is disposed in contact with a p type thermoelectric conversion material portion 22 and an n type thermoelectric conversion material portion 23, as in the above-described 7C type thermoelectric conversion element 21. A p type thermoelectric conversion material portion 22 is connected to an adjacent n type thermoelectric conversion material portion 23 on one side via a common high temperature side electrode 24. This p type thermoelectric conversion material portion 22 is also connected to an adjacent n type thermoelectric conversion material portion 23 on a side different from the above one side via a common low temperature side electrode 25, 26. In this manner, all the p type thermoelectric conversion material portions 22 and n type thermoelectric conversion material portions 23 are connected in series.

The low temperature side insulator substrate 28 is disposed on a main surface side of the plate-shaped low temperature side electrodes 25, 26 opposite to the side that contacts the p type thermoelectric conversion material portions 22 and the n type thermoelectric conversion material portions 23. One low temperature side insulator substrate 28 is disposed for the plurality of (all the) low temperature side electrodes 25, 26. The high temperature side insulator substrate 29 is disposed on a side of the plate-shaped high temperature side electrodes 24 opposite to the side that contacts the p type thermoelectric conversion material portions 22 and the n type thermoelectric conversion material portions 23. One high temperature side insulator substrate 29 is disposed for the plurality of (all the) high temperature side electrodes 24.

Wires 27 are connected to the high temperature side electrodes 24 or the low temperature side electrodes 25, 26 in contact with the p type thermoelectric conversion material portion 22 or the n type thermoelectric conversion material portion 23 located at respective ends of the series-connected p type thermoelectric conversion material portions 22 and n type thermoelectric conversion material portions 23. When a temperature difference is formed so that the high temperature side insulator substrate 29 side attains a high temperature and the low temperature side insulator substrate 28 side attains a low temperature, then the series-connected p type thermoelectric conversion material portions 22 and n type thermoelectric conversion material portions 23 permit a current to flow in the directions of the arrows I, as in the case of the 7C type thermoelectric conversion element 21 described above. In this manner, power generation by thermoelectric conversion using a temperature difference is achieved in the power generation module 41.

Embodiment 5

A description will now be made of an infrared sensor, which is an optical sensor, as another embodiment of the thermoelectric conversion element using the thermoelectric conversion material according to the present disclosure.

Figure 7:
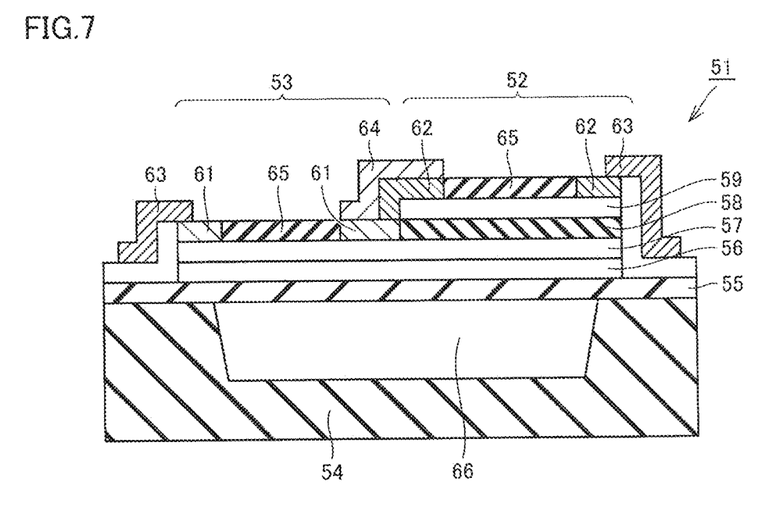
FIG. 7 shows an exemplary structure of an infrared sensor.

FIG. 7 shows an exemplary structure of an infrared sensor 51. Referring to FIG. 7, the infrared sensor 51 includes a p type thermoelectric conversion material portion 52 and an n type thermoelectric conversion material portion 53 disposed adjacent to each other. The p type thermoelectric conversion material portion 52 and the n type thermoelectric conversion material portion 53 are formed on a substrate 54.

The infrared sensor 51 includes the substrate 54, an etching stop layer 55, an n type thermoelectric conversion material layer 56, an $n^+$ type ohmic contact layer 57, an insulator layer 58, a p type thermoelectric conversion material layer 59, n side ohmic contact electrodes 61, p side ohmic contact electrodes 62, a heat absorption pad 63, an absorber 64, and a protective film 65.

The substrate 54 is composed of an insulator such as silicon dioxide. The substrate 54 has a recess 66 formed therein. The etching stop layer 55 is formed to cover a surface of the substrate 54. The etching stop layer 55 is composed of an insulator such as silicon nitride, for example. A gap is formed between the etching stop layer 55 and the recess 66 of the substrate 54.

The n type thermoelectric conversion material layer 56 is formed on a main surface of the etching stop layer 55 opposite to the substrate 54. The material constituting the n type thermoelectric conversion material layer 56 is the thermoelectric conversion material of Embodiment 1 or Embodiment 2 with its component composition adjusted to have n type conductivity, for example. The thermoelectric conversion material of Embodiment 1 or Embodiment 2 constituting the n type thermoelectric conversion material layer 56 is doped with n type impurities that cause the generation of n type carriers (electrons) as majority carriers, for example, so that the n type thermoelectric conversion material layer 56 has n type conductivity. The $n^+$ type ohmic contact layer 57 is formed on a main surface of the n type thermoelectric conversion material layer 56 opposite to the etching stop layer 55. The $n^+$ type ohmic contact layer 57 is doped with n type impurities that cause the generation of n type carriers (electrons) as majority carriers, for example, at a higher concentration than the n type thermoelectric conversion material layer 56. Thus, the $n^+$ type ohmic contact layer 57 has n type conductivity.

The n side ohmic contact electrode 61 is disposed to contact a central portion of a main surface of the $n^+$ type ohmic contact layer 57 opposite to the n type thermoelectric conversion material layer 56. The n side ohmic contact electrode 61 is composed of a material that can make ohmic contact with the $n^+$ type ohmic contact layer 57, such as a metal. The insulator layer 58, composed of an insulator such as silicon dioxide, for example, is disposed on the main surface of the $n^+$ type ohmic contact layer 57 opposite to the n type thermoelectric conversion material layer 56. The insulator layer 58 is disposed on the main surface of the $n^+$ type ohmic contact layer 57 on the p type thermoelectric conversion material portion 52 side with respect to the n side ohmic contact electrode 61.

The protective film 65 is also disposed on the main surface of the $n^+$ type ohmic contact layer 57 opposite to the n type thermoelectric conversion material layer 56. The protective film 65 is disposed on the main surface of the $n^+$ type ohmic contact layer 57 on the opposite side from the p type thermoelectric conversion material portion 52 side with respect to the n side ohmic contact electrode 61. On the main surface of the $n^+$ type ohmic contact layer 57 opposite to the n type thermoelectric conversion material layer 56, another n side ohmic contact electrode 61 is disposed on the opposite side from the above-described n side ohmic contact electrode 61, with the protective film 65 sandwiched therebetween.

The p type thermoelectric conversion material layer 59 is formed on a main surface of the insulator layer 58 opposite to the $n^+$ type ohmic contact layer 57. The material constituting the p type thermoelectric conversion material layer 59 is the thermoelectric conversion material of Embodiment 1 or Embodiment 2 with its component composition adjusted to have p type conductivity, for example. The thermoelectric conversion material of Embodiment 1 or Embodiment 2 constituting the p type thermoelectric conversion material layer 59 is doped with p type impurities that cause the generation of p type carriers (holes) as majority carriers, for example, whereby the p type thermoelectric conversion material layer 59 has p type conductivity.

The protective film 65 is disposed at a central portion on a main surface of the p type thermoelectric conversion material layer 59 opposite to the insulator layer 58. On the main surface of the p type thermoelectric conversion material layer 59 opposite to the insulator layer 58, a pair of p side ohmic contact electrodes 62 are disposed sandwiching the protective film 65 therebetween. The p side ohmic contact electrodes 62 are composed of a material that can make ohmic contact with the p type thermoelectric conversion material layer 59, such as a metal. Of the pair of p side ohmic contact electrodes 62, the p side ohmic contact electrode 62 on the n type thermoelectric conversion material portion 53 side is connected to the n side ohmic contact electrode 61.

The absorber 64 is disposed to cover main surfaces of the mutually connected p side ohmic contact electrode 62 and n side ohmic contact electrode 61 opposite to the $n^+$ type ohmic contact layer 57. The absorber 64 is composed of titanium, for example. The heat absorption pad 63 is disposed to be in contact with the top surface of the p side ohmic contact electrode 62 that is not connected to the n side ohmic contact electrode 61. The heat absorption pad 63 is also disposed to be in contact with the top surface of the n side ohmic contact electrode 61 that is not connected to the p side ohmic contact electrode 62. As a material constituting the heat absorption pad 63, gold (Au)/titanium (Ti), for example, is adopted.

When the infrared sensor 51 is irradiated with infrared rays, the absorber 64 absorbs the energy of the infrared rays. As a result, the temperature of the absorber 64 rises. On the other hand, the temperature rise of the heat absorption pad 63 is suppressed. This forms a temperature difference between the absorber 64 and the heat absorption pad 63. Accordingly, in the p type thermoelectric conversion material layer 59, p type carriers (holes) move from the absorber 64 side toward the heat absorption pad 63 side. On the other hand, in the n type thermoelectric conversion material layer 56, n type carriers (electrons) move from the absorber 64 side toward the heat absorption pad 63 side. Then, by extracting a current generated as a result of the migration of the carriers from the n side ohmic contact electrodes 61 and the p side ohmic contact electrodes 62, the infrared rays are detected.

In the infrared sensor 51 of the present embodiment, as the materials constituting the p type thermoelectric conversion material layer 59 and the n type thermoelectric conversion material layer 56, the thermoelectric conversion material of Embodiment 1 or Embodiment 2 is adopted which has an increased value of ZT by virtue of a sufficiently high value of electrical conductivity. As a result, the infrared sensor 51 is a high-sensitivity infrared sensor.

In the above-described embodiments, the base material included in the thermoelectric conversion material is a semiconductor having Si and Ge as the constituent elements. However, the base material is not limited thereto; it may be a SiGe material. SiGe materials mean SiGe and materials in which a part of at least one of Si and Ge in SiGe has been replaced by another element, such as C, Sn, or the like. In this manner as well, the efficiency of thermoelectric conversion can be improved.

It should be understood that the embodiments disclosed herein are illustrative and non-restrictive in every respect. The scope of the present disclosure is defined by the terms of the claims, rather than the description above, and is intended to include any modifications within the scope and meaning equivalent to the terms of the claims.

DESCRIPTION OF REFERENCE NUMERALS 1, 11 thermoelectric conversion material
2, 12 amorphous phase
3, 13 crystal phase
6 line
21 π type thermoelectric conversion element 22, 52 p type thermoelectric conversion material portion
23, 53 n type thermoelectric conversion material portion
24 high temperature side electrode
25 first low temperature side electrode (low temperature side electrode)
26 second low temperature side electrode (low temperature side electrode)
27, 42, 43 wire
28 low temperature side insulator substrate
29 high temperature side insulator substrate
31, 32, 33, 34 end
41 thermoelectric conversion module
51 infrared sensor
54 substrate
55 etching stop layer
56 n type thermoelectric conversion material layer
57 $n^+$ type ohmic contact layer
58 insulator layer
59 p type thermoelectric conversion material layer
61 n side ohmic contact electrode
62 p side ohmic contact electrode
63 heat absorption pad
64 absorber
65 protective film
66 recess
I arrow

The invention claimed is:

1. A thermoelectric conversion element comprising:
a thermoelectric conversion material portion;
a first electrode disposed in contact with the thermoelectric conversion material portion; and
a second electrode disposed in contact with the thermoelectric conversion material portion and apart from the first electrode;
the thermoelectric conversion material portion being constituted by a p type thermoelectric conversion material and an n type thermoelectric conversion material,
wherein each of the p type thermoelectric conversion material and the n type thermoelectric conversion material includes:
a base material that is a semiconductor having Si and Ge as constituent elements;
at least one additive element that is different from the constituent elements, the at least one additive element having a vacant orbital in a d or f orbital located inside an outermost shell thereof and forming a corresponding at least one additional level in a forbidden band of the base material; and
oxygen, the oxygen having a content ratio of 6 at % or less, and
wherein the at least one additive element of the n type thermoelectric conversion material comprises Fe and P, and
wherein a relative amount of atoms constituting the n type thermoelectric conversion material is in the order of Si>Ge>P>Fe.

2. The thermoelectric conversion element according to claim 1, wherein each of the p type thermoelectric conversion material and the n type thermoelectric conversion material has a microstructure including a crystal phase composed of the constituent elements, the crystal phase having a grain diameter of 30 nm or less.

3. The thermoelectric conversion element according to claim 1,
wherein the at least one additive element of each of the p type thermoelectric conversion material and the n type thermoelectric conversion material comprises a first additive element and a second additive element that is different from both the constituent elements and the first additive element, wherein, for each of the p type thermoelectric conversion material and the n type thermoelectric conversion material:
the first additional level forms a first additional level, of the at least one additional level, in the forbidden band of the base material, and
the second additive element forms a second additional level, of the at least one additional level, in the forbidden band of the base material different from the first additional level, wherein
a difference between a number of electrons in an outermost shell of the second additive element and a number of electrons in an outermost shell of at least one of the constituent elements is 1.

4. The thermoelectric conversion element according to claim 1, wherein the at least one additive element of the p type thermoelectric conversion material is Au or Cu.

5. The thermoelectric conversion element according to claim 3, wherein
the thermoelectric conversion material portion that is constituted by the n type thermoelectric conversion material comprises the Fe as the first additive element and the P as the second additive element.

6. The thermoelectric conversion element according to claim 3, wherein
the thermoelectric conversion material portion that is constituted by the p type thermoelectric conversion material comprises Au or Cu as the first additive element and B as the second additive element.

7. A thermoelectric conversion module comprising a plurality of the thermoelectric conversion elements according to claim 1.

8. An optical sensor comprising:
an absorber that absorbs optical energy; and
a thermoelectric conversion material portion connected to the absorber,
the thermoelectric conversion material portion being constituted by a p type thermoelectric conversion material and an n type thermoelectric conversion material,
wherein each of the p type thermoelectric conversion material and the n type thermoelectric conversion material includes:
a base material that is a semiconductor having Si and Ge as constituent elements;
at least one additive element that is different from the constituent elements, the at least one additive element having a vacant orbital in a d or f orbital located inside an outermost shell thereof and forming a corresponding at least one additional level in a forbidden band of the base material; and
oxygen, the oxygen having a content ratio of 6 at % or less, and
wherein the at least one additive element of the n type thermoelectric conversion material comprises Fe and P, and
wherein a relative amount of atoms constituting the n type thermoelectric conversion material is in the order of Si>Ge>P>Fe.

9. The optical sensor according to claim 8, wherein each of the p type thermoelectric conversion material and the n type thermoelectric conversion material has a microstructure including a crystal phase composed of the constituent elements, the crystal phase having a grain diameter of 30 nm or less.

10. The optical sensor according to claim 8, wherein the at least one additive element of each of the p type thermoelectric conversion material and the n type thermoelectric conversion material comprises a first additive element and a second additive element that is different from both the constituent elements and the first additive element, wherein, for each of the p type thermoelectric conversion material and the n type thermoelectric conversion material:

the first additional level forms a first additional level, of the at least one additional level, in the forbidden band of the base material, and the second additive element forms a second additional level, of the at least one additional level, in the forbidden band of the base material different from the first additional level, wherein a difference between a number of electrons in an outermost shell of the second additive element and a number of electrons in an outermost shell of at least one of the constituent elements is 1.

11. The optical sensor according to claim 8, wherein the at least one additive element of the p type thermoelectric conversion material is Au or Cu.

12. The optical sensor according to claim 10, wherein the thermoelectric conversion material portion that is constituted by the n type thermoelectric conversion material comprises the Fe as the first additive element and the P as the second additive element.

13. The optical sensor according to claim 10, wherein the thermoelectric conversion material portion that is constituted by the p type thermoelectric conversion material comprises Au or Cu as the first additive element and B as the second additive element.

14. The thermoelectric conversion element according to claim 1, wherein each of the p type thermoelectric conversion material and the n type thermoelectric conversion material is formed in an Argon gas so as to result in the oxygen having the content ratio of 6 at % or less.

15. The thermoelectric conversion element according to claim 1, wherein the thermoelectric conversion element is a π shaped thermoelectric conversion element.

* * * * *